United States Patent
Ebert

(10) Patent No.: US 11,372,480 B1
(45) Date of Patent: *Jun. 28, 2022

(54) PUPIL STEERING: FLEXURE GUIDANCE SYSTEMS

(71) Applicant: Facebook Technologies, LLC, Menlo Park, CA (US)

(72) Inventor: Ryan Michael Ebert, Issaquah, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/242,100

(22) Filed: Apr. 27, 2021

Related U.S. Application Data

(63) Continuation of application No. 16/584,206, filed on Sep. 26, 2019, now Pat. No. 11,036,290.

(Continued)

(51) Int. Cl.
 G06F 3/01 (2006.01)
 G06F 3/03 (2006.01)
 (Continued)

(52) U.S. Cl.
 CPC ............. G06F 3/013 (2013.01); G02B 6/24 (2013.01); G02B 27/017 (2013.01);
 (Continued)

(58) Field of Classification Search
 CPC ...... G06F 3/013; G06F 3/0304; G06F 3/0321; G06F 3/011; G02B 27/017; G02B 6/24; G02B 2027/0178; G02B 27/0093; G02B 27/0172; G02B 27/0176; G02B 7/005; H01L 41/0926
 See application file for complete search history.

(56) References Cited

U.S. PATENT DOCUMENTS

| 9,094,677 | B1 | 7/2015 | Mendis et al. |
| 10,042,178 | B2 | 8/2018 | Park et al. |

(Continued)

FOREIGN PATENT DOCUMENTS

WO 2020/101943 A1 5/2020

OTHER PUBLICATIONS

Non-Final Office Action received for U.S. Appl. No. 16/584,206 dated Sep. 4, 2020, 20 pages.

(Continued)

Primary Examiner — Vijay Shankar
(74) Attorney, Agent, or Firm — FisherBroyles, LLP

(57) ABSTRACT

A flexure guidance system may be provided for controlling movement of an optical subassembly and/or a connected combiner lens. For instance, the flexure guidance system may include a distal end piece, a proximal end piece, and multiple wire flexures that link the distal end piece to the proximal end piece. The linking wire flexures may be spaced to form an interior cavity between the distal end piece and the proximal end piece. This interior cavity may house various electronic components. One or more actuators in the system may move the electronic components according to input signals along different axes of movement provided by the wire flexures. Various other methods, systems, and computer-readable media are also disclosed.

20 Claims, 16 Drawing Sheets

Related U.S. Application Data

(60) Provisional application No. 62/760,415, filed on Nov. 13, 2018.

(51) Int. Cl.
  *G02B 6/24* (2006.01)
  *G02B 27/01* (2006.01)
  *H01L 41/09* (2006.01)

(52) U.S. Cl.
  CPC .......... *G06F 3/0304* (2013.01); *G06F 3/0321* (2013.01); *G02B 2027/0178* (2013.01); *H01L 41/0926* (2013.01)

(56) References Cited

U.S. PATENT DOCUMENTS

| | | | |
|---|---|---|---|
| 10,394,033 | B2 | 8/2019 | Bohn |
| 11,036,290 | B1 * | 6/2021 | Ebert .................... G06F 3/0321 |
| 2013/0293447 | A1 | 11/2013 | Bickerstaff et al. |
| 2016/0139425 | A1 | 5/2016 | Park et al. |
| 2018/0101014 | A1 | 4/2018 | Bohn |

OTHER PUBLICATIONS

Notice of Allowance received for U.S. Appl. No. 16/584,206 dated Feb. 26, 2021, 15 pages.

International Search Report and Written Opinion received for PCT Application Serial No. PCT/US2019/059802 dated Apr. 24, 2020, 15 pages.

International Preliminary Report on Patentability for International Application No. PCT/US2019/059802, dated May 27, 2021, 10 Pages.

* cited by examiner

PUPIL STEERING: FLEXURE GUIDANCE SYSTEMS

CROSS REFERENCE TO RELATED APPLICATION

This application is a continuation of U.S. patent application Ser. No. 16/584,206, filed Sep. 26, 2019, which claims the benefit of U.S. Provisional Application No. 62/760,415, filed 13 Nov. 2018, the disclosure of each of which are incorporated herein, by reference, in their entireties.

BACKGROUND

Virtual reality (VR) and augmented reality (AR) systems display images to a user in an attempt to create virtual or modified worlds. Such systems typically have some type of eyewear such as goggles or glasses. These goggles and glasses project images onto the user's eyes. The user then sees either an entirely virtual world, or sees his or her real-world surroundings, augmented by additional images.

These VR and AR systems, however, have the unfortunate downside that wearers of the associated goggles or glasses often get motion sickness. This is sometimes due to the virtual or augmented world not responding the way the user's brain expects. For instance, a user may move their head or their eyes in a given direction, but the virtual or augmented images do not appear where the user expected them. If this happens repeatedly, the user may experience vertigo, nausea or headaches.

SUMMARY

As will be described in greater detail below, the instant disclosure describes a flexure guidance system and methods of controlling movement of an optical subassembly using a flexure guidance system. As noted above, AR and VR displays often suffer from lag, jitter, slow processing or other hardware or software problems that cause the generated image to differ from what the user expects. These differences may be magnified as the user moves their eyes, head or body. Over time, if the images on the display screen do not match up with the user's expectations, the user's brain may experience fatigue, vertigo or other negative side effects.

In some examples, a flexure guidance system may be provided for controlling movement of an optical subassembly and/or a connected combiner lens. For instance, the flexure guidance system may include a distal end piece, a proximal end piece, and multiple wire flexures that link the distal end piece to the proximal end piece. The linking wire flexures may be spaced to form an interior cavity between the distal end piece and the proximal end piece. This interior cavity may house various electronic components. One or more actuators in the system may move the electronic components according to input signals along different axes of movement provided by the wire flexures.

In some examples, the electronic components of the flexure guidance system may include an optical subassembly. The optical subassembly may include a laser, a waveguide, and a spatial light modulator (e.g. a liquid crystal on silicon (LCOS) device).

In some examples, the flexure guidance system may allow movement of the distal end piece in the x and y directions relative to the proximal end piece, while substantially preventing movement of the distal end piece in the z direction.

In some examples, the wire flexures may each be respectively rigidly connected at each end to the distal end piece and the proximal end piece. In some cases, the system may include four wire flexures, and the distal end piece and the proximal end piece may be substantially square-shaped. In such cases, the four wire flexures may be rigidly connected to each of the four corners of the distal end piece and the proximal end piece. In some cases, each of the four wire flexures may itself comprise a group of wire flexures. As such, the four corners of the distal end piece and the four corners of the proximal end piece may be connected using the four groups of wire flexures.

In some examples, the wire flexures may be made of titanium, stainless steel, beryllium, or other metal. In some examples, the distal end piece and/or the proximal end piece may be substantially radially-shaped. In some examples, the flexure guidance system may further include components affixed thereto that compensate for movement of the wire flexures or the distal end piece in the z-axis direction.

In some examples, the distal end piece or the proximal end piece may include an array of tiles. In some embodiments, the actuators may be piezoelectric benders, walking piezoelectric actuators, or inertia-based actuators. In some examples, the control inputs of the flexure guidance system may be generated based on tracked eye movements of a user's eye (or pair of eyes).

In one example, a computer-implemented method for controlling movement of an optical assembly and connected combiner lens may include receiving control inputs at a controller. The controller may be part of an optical subassembly that is connected to a combiner lens via a flexure guidance system. The method may include determining a current position of the combiner lens relative to a frame. The combiner lens may be at least partially transmissive to visible light, and may be configured to direct image data provided by the optical subassembly to a user's eye. The method may further include actuating an actuator configured to move the optical subassembly and connected combiner lens according to the received control inputs. The actuator may move the optical subassembly and connected combiner lens through translational movements in the flexure guidance system.

In some examples, the method may include tracking eye movements of the user relative to the combiner lens, and generating the control inputs based on the tracked eye movements. In some examples, the actuator may apply motive force to a distal end of the flexure guidance system. In some cases, piezoelectric strain sensors may be implemented to monitor for flexure of the flexure guidance system. The piezoelectric strain sensors may be calibrated to zero to measure strain differential values as movements are applied by the actuators.

In some examples, linear strip encoders may be affixed to the distal end of the flexure guidance system. These linear strip encoders may be implemented to determine movement of the optical subassembly and the connected combiner lens.

In some examples, a flexure guidance system is provided that includes a distal end piece, a proximal end piece, and a plurality of blade flexures that link the distal end piece to the proximal end piece. The linking blade flexures may be spaced to form an interior cavity between the distal end piece and the proximal end piece, where the interior cavity houses one or more electronic components. The actuators may move the electronic components according to input signals along one or more axes of movement provided by the plurality of blade flexures.

In some examples, the electronic components include an optical subassembly that has at least one laser, at least one waveguide, and at least one spatial light modulator. In some examples, the plurality of blade flexures may be made of titanium, stainless steel, and/or beryllium.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
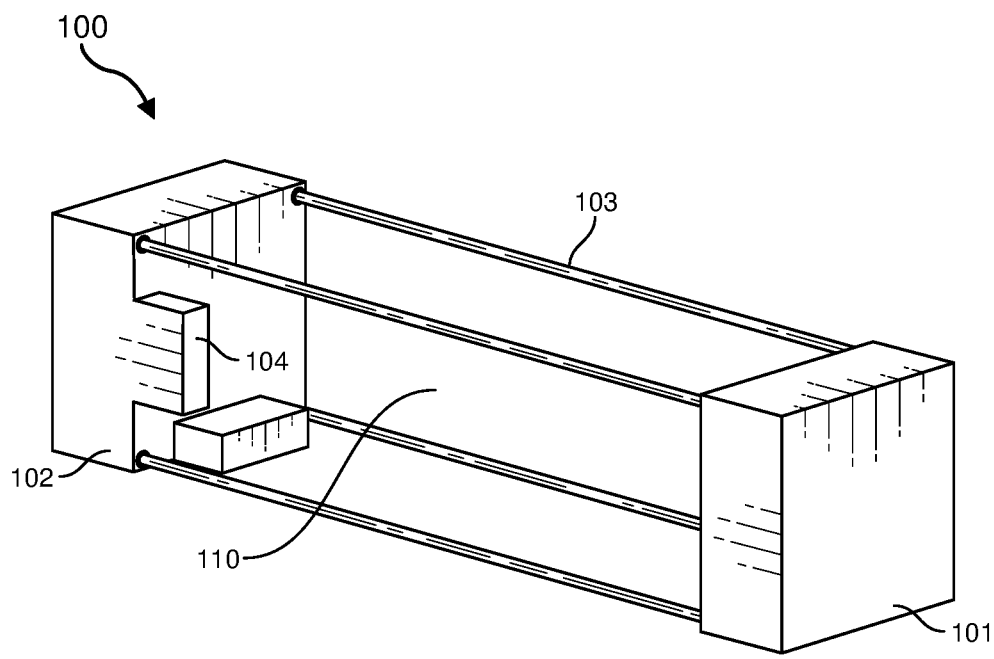
FIG. 1 illustrates an embodiment of a flexure guidance system in an initial state.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to a flexure guidance system and methods of controlling movement of an optical subassembly using such a flexure guidance system. As noted above, users of traditional AR and VR devices often complain of vertigo or headaches. These may result from lag, jitter, slow processing or other hardware- or software-related problems that cause the generated image to differ from what the user expects. As will be explained in greater detail below, embodiments of the instant disclosure may provide stability, clarity and accuracy to AR and VR displays. This stability, clarity and accuracy may be maintained even as a user moves their eyes, head or body.

The following will provide, with reference to FIGS. 1-12, detailed descriptions of various embodiments of a flexure guidance system, as well as methods for controlling movement of an optical subassembly and attached combiner lens using a flexure guidance system. For example, a flexure guidance system 100 may be provided for controlling movement of an optical subassembly (e.g., 105 of FIG. 5) and/or a connected combiner lens (e.g., 108 of FIG. 5). The flexure guidance system 100 may include a proximal end piece 101, a distal end piece 102, and multiple wire flexures 103 that link the proximal end piece 101 to the distal end piece 102. As the terms are used herein, a "proximal end piece" may refer to an end piece that is substantially stationary, while a "distal end piece" may refer to an end piece that moves relative to the proximal end piece. As shown in FIGS. 6A and 6B, for example, the distal end piece 102 may move (along with the optical subassembly 105 and the combiner lens 108) in relation to the proximal end piece 101 to move the combiner lens and optics in conjunction with the movements of the user's eyes.

The linking wire flexures 103 may be spaced to form an interior cavity 110 between the distal end piece and the proximal end piece. This interior cavity 110 may house various electronic components, including optical subassembly 105 of FIG. 5. Actuators in the system (e.g., actuators 106 of FIG. 7) may move the electronic components according to input signals along different axes of movement provided by the wire flexures 103. In some embodiments, the actuators may be piezoelectric bimorphs. In other cases, the actuators may be piezoelectric benders, walking piezoelectric actuators, piezoelectric inertia actuators, mechanically-amplified piezo block actuators, voice coil actuators, DC motors, brushless DC motors, stepper motors, microfluidic actuators, resonance-based actuators, or other types of actuators.

In some embodiments, the distal end piece 101 and the proximal end piece 102 may be square, as shown in FIG. 1. However, substantially any other shape may be possible. The distal and proximal end pieces may be circular, triangular, rectangular, oval, diamond or fashioned in some other shape. Moreover, the distal and proximal end pieces need not be the same shape. Thus, one end piece could be circular, while the other end is square, and so on. Furthermore, it will be understood that the thicknesses of the end pieces 101 and 102, and the length and thicknesses of the wire flexures 103 were chosen arbitrarily, and each may be thicker or thinner than shown in FIG. 1. The size of each end piece may also vary in different implementations, as can the materials used to create the end pieces and flexure wires. The figures are thus not necessarily drawn to scale.

In some embodiments, the wire flexures may be composed of titanium, stainless steel, beryllium, or other metals or combinations of metals. In other embodiments, the wire flexures may be made of composite materials, plastic or other materials that are capable of relatively small movements, yet generally hold the structure in place.

Figure 2:
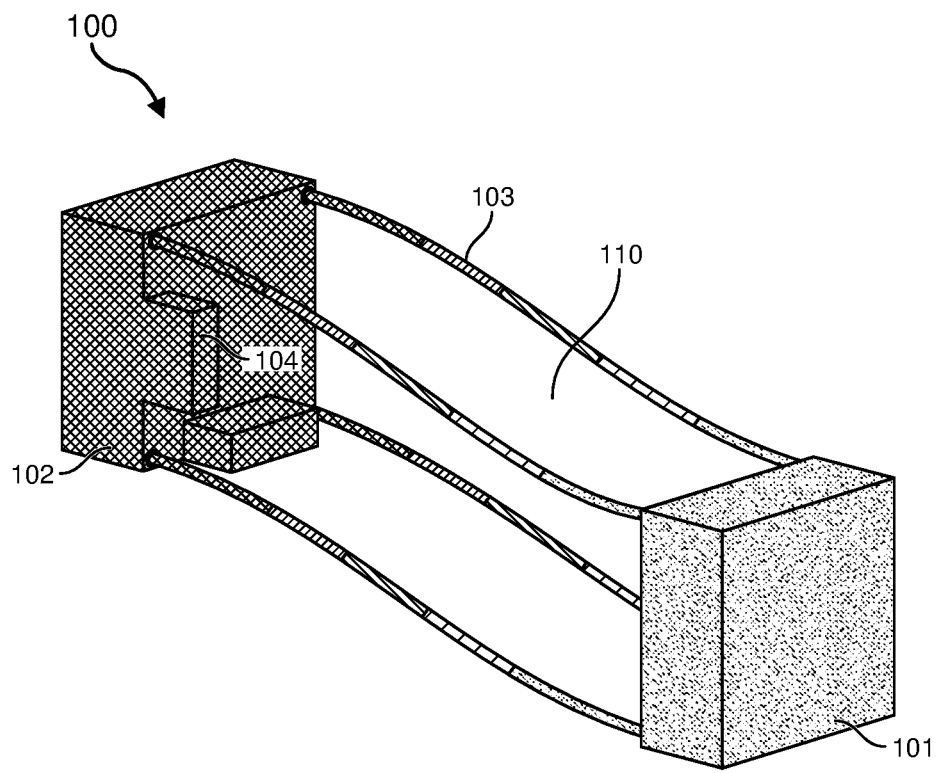
FIG. 2 illustrates an embodiment of a flexure guidance system in a bent or flexed state.
Figure 3A:
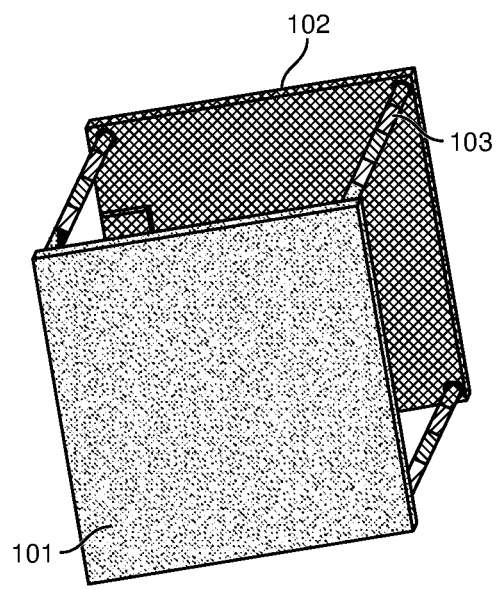
FIG. 3A illustrates an embodiment of a flexure guidance system in a state in which the distal end piece has been moved down and left relative to the proximal end piece.
Figure 3B:
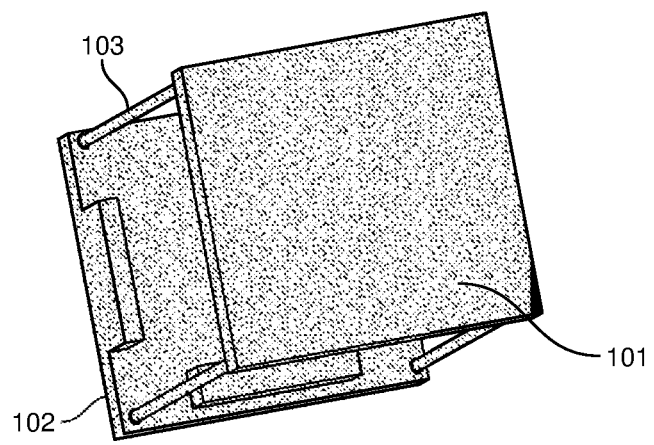
FIG. 3B illustrates an embodiment of a flexure guidance system in a state in which the distal end piece has been moved up and right relative to the proximal end piece.

As shown in FIG. 2, the flexure guidance system 100 may, for example, allow movement of the distal end piece 102 in the x and y directions relative to the proximal end piece 101, while substantially preventing movement of the distal end piece in the z direction. In FIG. 2, the proximal end piece 101 stays substantially stationary, but the distal end piece 102 has been raised along the y-axis relative to the proximal end piece 101. Various shading marks have been applied to the flexure guidance system 100 of FIG. 2 to show that the wire flexures 103 and other parts may experience strain during the movements. In FIG. 3A, the distal end piece 102 is moved both up the y-axis and to the right along the x-axis, relative to the proximal end piece 101. In FIG. 3B, the distal end piece 102 is moved both down the y-axis and to the left along the x-axis, relative to the proximal end piece 101. Thus, the distal end piece may be moved in a quadrilateral manner relative to the proximal end piece.

Figure 4:
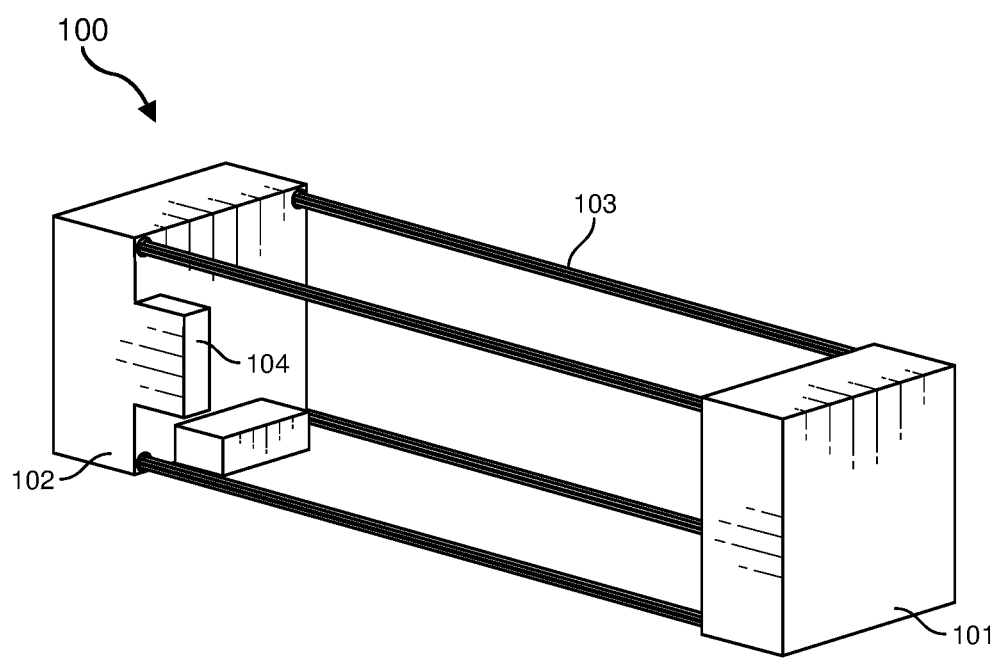
FIG. 4 illustrates an embodiment of a flexure guidance system in which a grouping of wires is used at each joint.

As shown in FIG. 4, the wires 103 may be single wires, or groups of wires. The wire flexures 103 in FIG. 4, for example, each have four wires. These wires may act in unison to allow flexure along the x- and y-axes, while substantially preventing motion along the z-axis. Accordingly, although the distal end piece moves in the x-y directions with respect to the proximal end piece, it does not move toward or away from the proximal end piece along the z-axis.

This freedom of controlled movement allows the flexure guidance system 100 to provide a structure in which an optics subassembly and combiner lens may be actuated to move in conjunction with a user's eye movements. In such cases, the optics subassembly and combiner lens may be attached to the distal end piece 102, and may move with the distal end piece while the proximal end piece 101 remains substantially stationary. This will be explained further below with regard to FIGS. 5-8.

Figure 5:
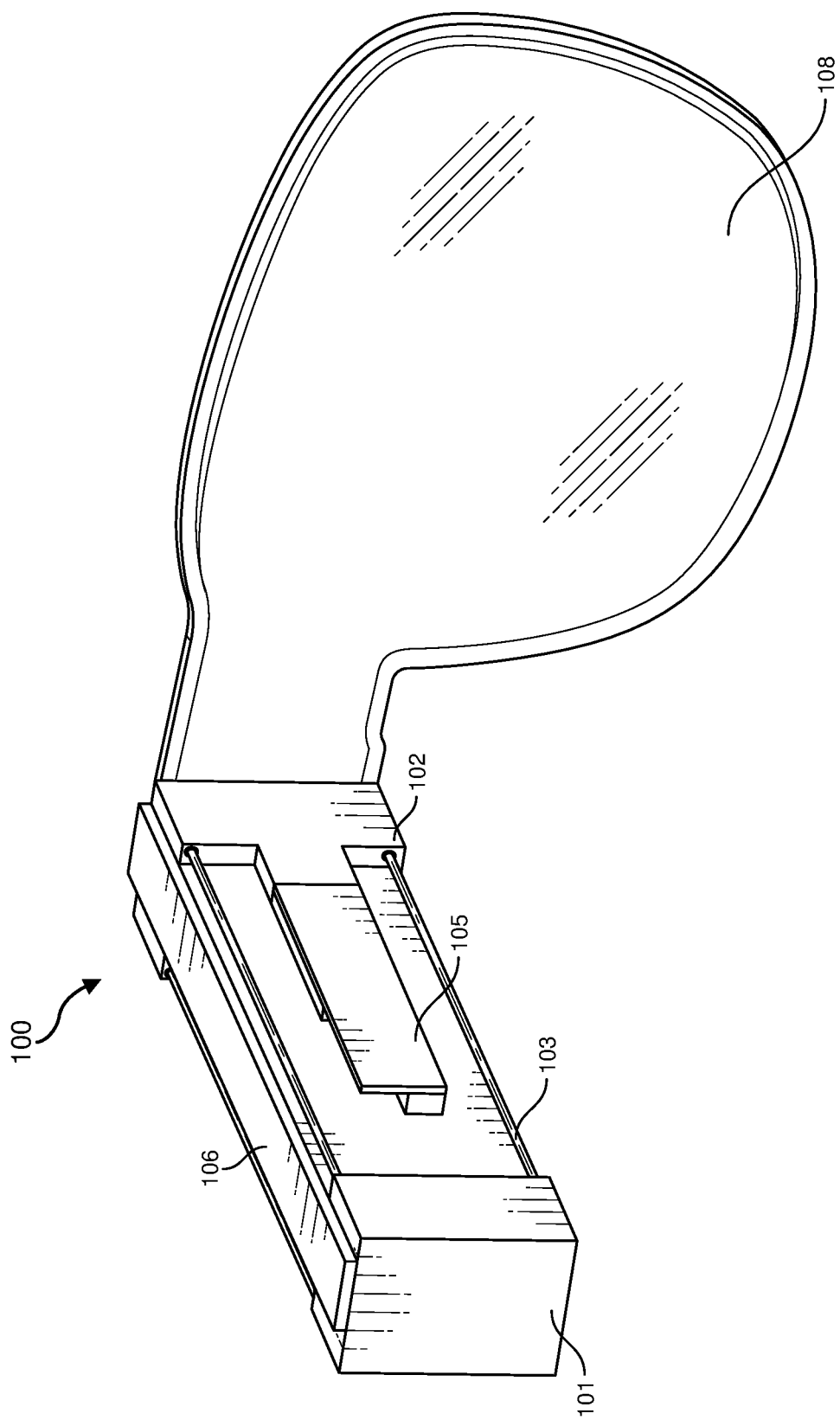
FIG. 5 illustrates an embodiment of a flexure guidance system in which the flexure guidance system is implemented within augmented reality glasses.

For instance, in FIG. 5, the flexure guidance system 100 of FIG. 1 may be implemented in a pair of augmented reality (AR) or virtual reality (VR) glasses. The glasses may include a lens 101 that is at least partially transmissive to light. As such, the lens 101 may allow light from the user's surroundings to travel through the lens and to the user's eyes. In cases where the lens 101 is a combiner lens, not only can outside light reach the user's eyes, but also light from an optics assembly. An optics assembly (e.g., 105) may include a light source such as a laser, a spatial light modulator such as a liquid crystal on silicon (LCOS)) and a waveguide. These components may be used together to generate and project images to a user. In embodiments where the lens 101 is a combiner lens, the light waves generated by the light source are projected toward the combiner lens, and are diffracted or reflected to the user's eye. The combiner lens may refer to any type of partially transmissive lens that allows surrounding light to come through, while also reflecting or diffracting light from the light source in the optics subassembly 105. The combiner lens may thus provide an augmented or mixed reality environment for the user in which the user sees their outside world as they normally would through a pair of fully transparent glasses, but also sees images projected by the optics subassembly 105.

Objects in these images may be fixed in space (i.e. tied to a certain location), or may move with the user as the user moves their head or physically moves between locations.

As the user moves, changes head positions, or simply moves their eyes, the user may expect to see different images, or may expect the images to shift in a certain manner. The embodiments herein allow for the user to make such movements, while mechanically compensating for these movements to provide a clear and optically pleasing image to the user. The optics subassembly 105 may be mounted to a connecting member, which is itself connected to the combiner lens at the distal end piece 102. The combiner lens 101 may be positioned next to or mounted within the frame of the glasses, but may have full range of movement relative to the frame. Thus, if the distal end piece 102 moves, the combiner lens 101 and the optics subassembly 105 may move in tandem. By making small adjustments to the image source (e.g., optics subassembly 105) and the combiner lens 101, the systems herein can compensate for the user's eye movements, head movements, bodily movements (including walking or running), or other types of movement. The compensatory movements occur by translating movements from actuators 106 to translational movements in the distal end piece 102. These compensatory movements of both the light projector and the combiner lens may reduce the negative effects that may be experienced by users when a projected AR or VR image does not align with what the user's brain expects. The systems described herein actively move with the user, and provide a more desirable user experience.

Figure 7:
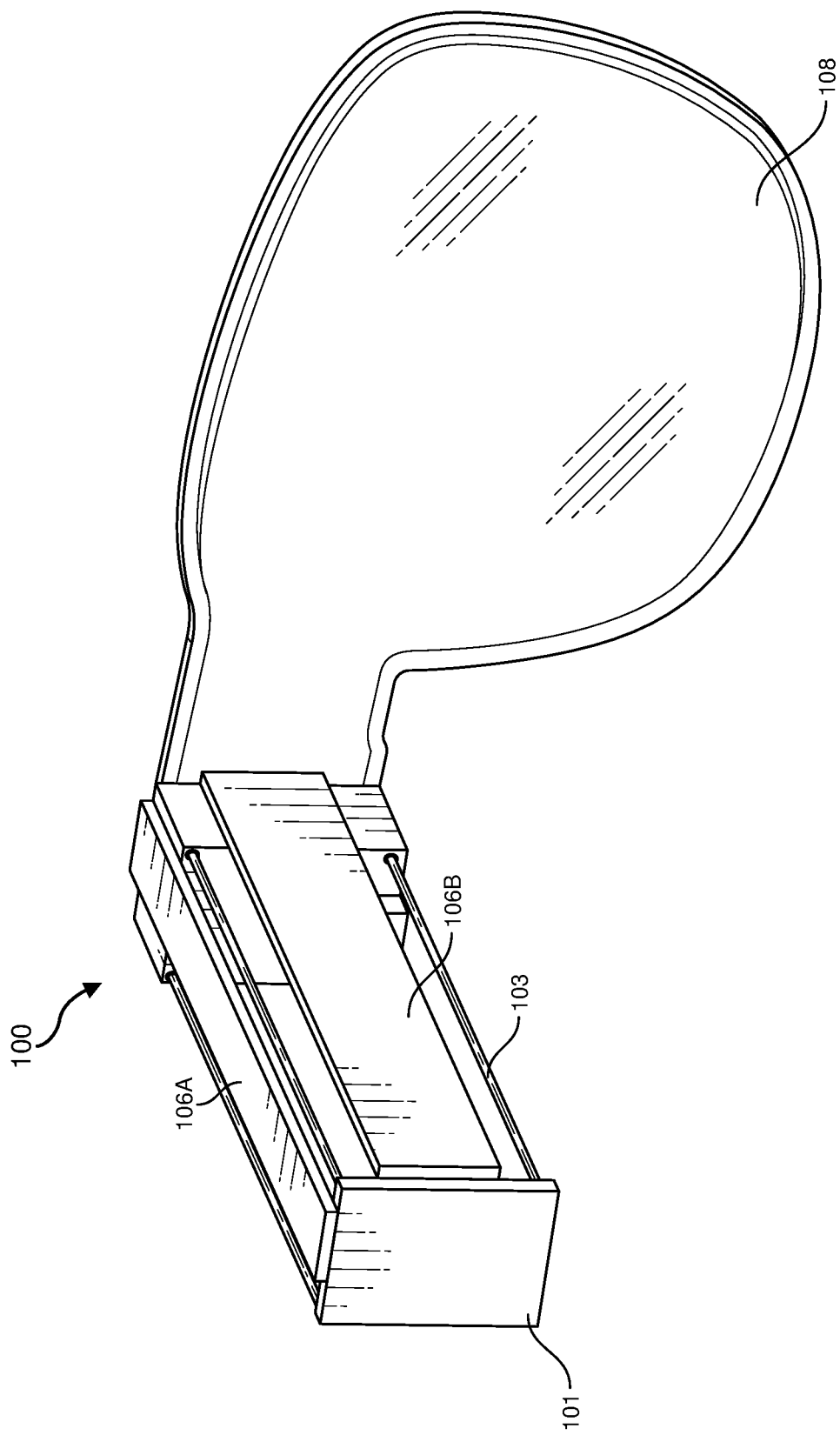
FIG. 7 illustrates an embodiment of a flexure guidance system in which actuators move the frame in accordance with the flexure guidance system.

The actuators 106 shown in FIG. 5, and the actuators 106A and 106B shown in FIG. 7 may be substantially any type of actuator that can move the distal end piece 102 along the x-axis and/or along the y-axis relative to the proximal end piece 101. The actuators may be piezoelectric benders, walking piezo actuators, piezoelectric inertia actuators, or other types of actuators. In response to an electrical stimulus signal, the piezoelectric benders, for example, may move from a stationary position to a slightly bent position. The amount of bend may be configurable, and may be specified in the control signal. When the piezoelectric bender contracts, it forms a bend in its structure. The piezoelectric bender may bend upward or downward, relative to a fixed end. Thus, if the proximal end of the bender 106 is fixed in place on the proximal end piece 101 of the flexure guidance system 100, the distal end of the bender 106 may bend upward or downward. This may then cause the distal end piece 102 to move upward or downward relative to the proximal end piece 101. In this manner, the flexure guidance system 100 may move upward, as shown in FIG. 2. The amount of movement may vary based on the type of actuator used, but at least some of the movements may be between 0-3 mm in either direction. Thus, if the user looks up or moves their head up, the combiner lens 101 and optics subassembly will move upward in tandem with the user when the actuator 106 moves the distal end piece 102 upward.

Figure 6A:
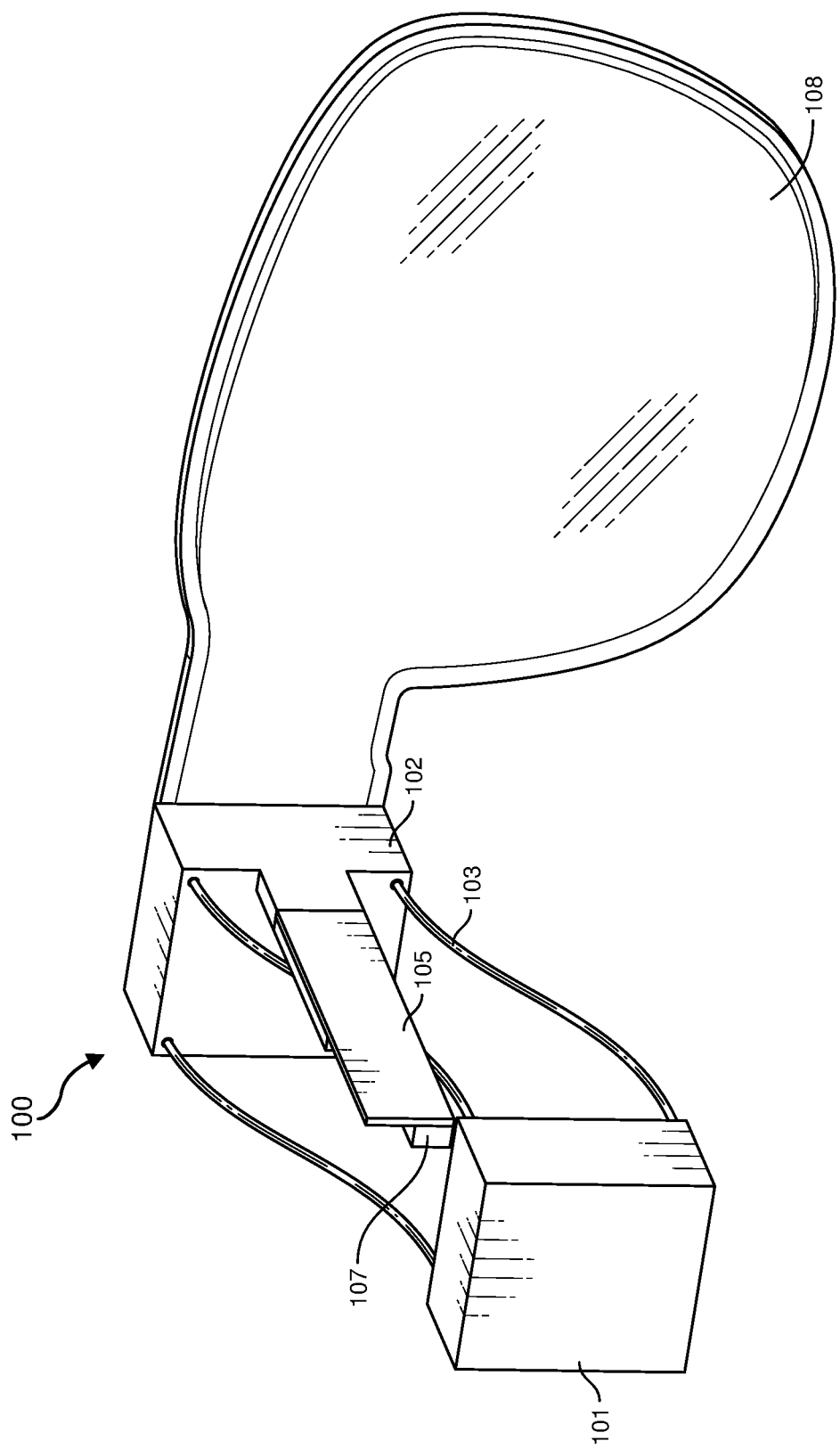
FIG. 6A illustrates an embodiment of a flexure guidance system in which the distal end piece has been moved upward along the y-axis relative to the proximal end piece.
Figure 6B:
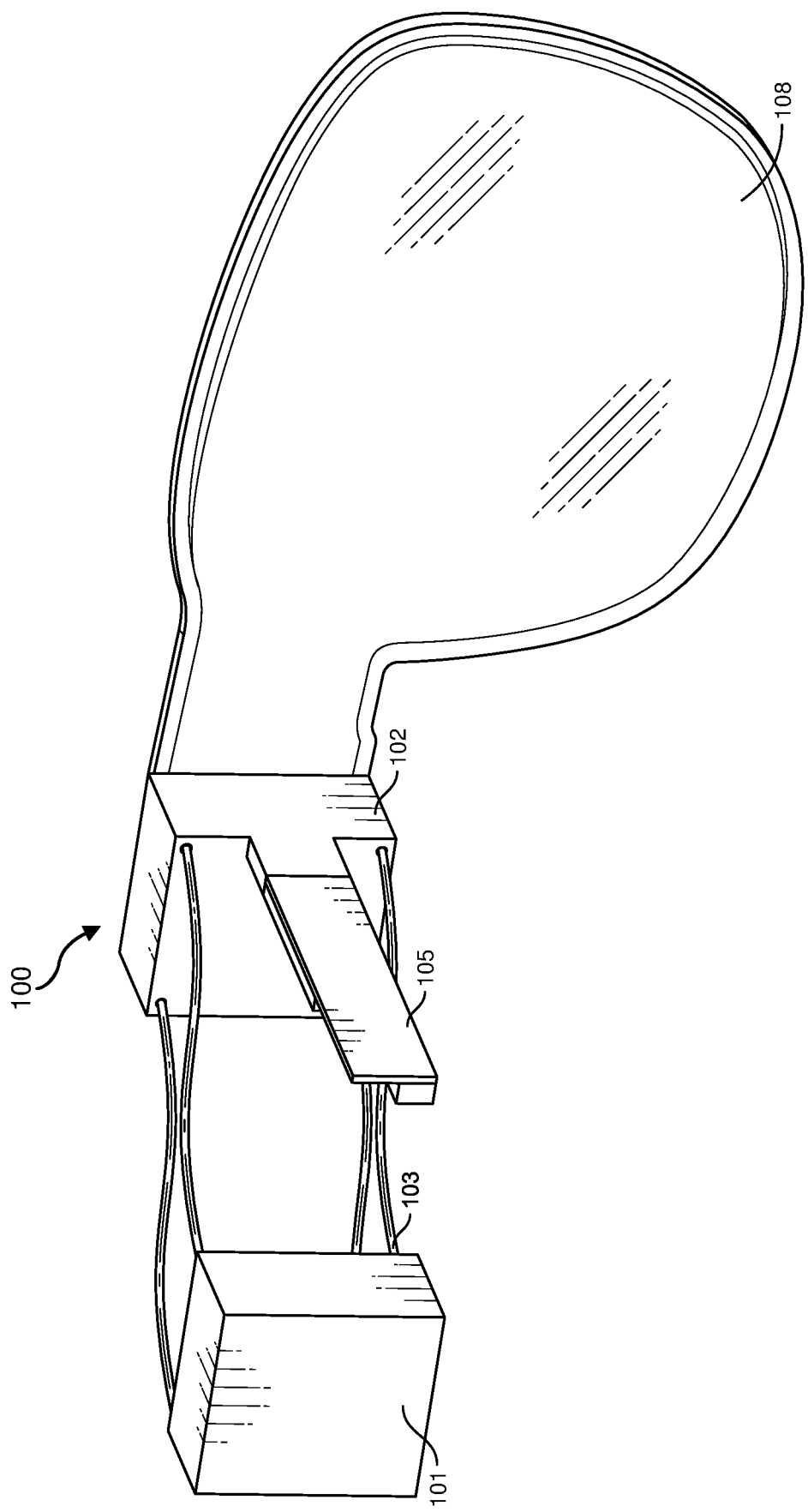
FIG. 6B illustrates an embodiment of a flexure guidance system in which the distal end piece has been moved to the right along the x-axis relative to the proximal end piece.

Thus, as shown in FIG. 6A, the distal end piece 102 may move upward relative to the proximal end piece 101. In FIG. 6B, the distal end piece 102 moves to the right relative to the proximal end piece 101. Thus, the optical assembly 105 (including the laser or other light source 107), and the combiner lens 108 move in tandem with the distal end piece 102. If the distal end piece 102 is moved by an actuator upward, downward, to the left or to the right, or in a combination of movements, the optical assembly 105 and the combiner lens 108 will continue to project an accurate image because the two are still aligned, regardless of how the distal end piece 102 moves.

FIG. 7 illustrates an embodiment in which multiple actuators are used. For example, actuator 106A may be placed on top of the flexure guidance system 100, while actuator 106B may be placed on the right side of the flexure guidance system. Corresponding left side and bottom actuators (not shown) may also be used. The actuator 106A may move the optical subassembly 105 and connected combiner lens 108 along the y-axis relative to the proximal end piece 101. The actuator 106B may move the optical subassembly 105 and the connected combiner lens 108 along the x-axis relative to the proximal end piece 101. Any movements along the y-axis may be supplemented by movements along the x-axis, and vice versa. As such, actuators may move the optical subassembly 105 and connected combiner lens 108 along both the x- and y-axes at the same time, resulting in quadrilateral movement. In this manner, bilateral movements along the x-axis or y-axis may be applied individually, or may be applied simultaneously in quadrilateral movements (e.g., upward and to the right, or downward and to the left, etc.). Some actuators may be able to move the optical subassembly 105 and connected combiner lens 108 in one direction (e.g., only to the left (not right) or only upward (not downward), while other actuators may be able to move the optical subassembly 105 and connected combiner lens 108 in two directions (e.g., right and left, or upward and downward). Different combinations of actuators may be used within the flexure guidance system 100 to move the optical subassembly 105 and connected combiner lens 108 as needed in a given implementation.

Figure 8:
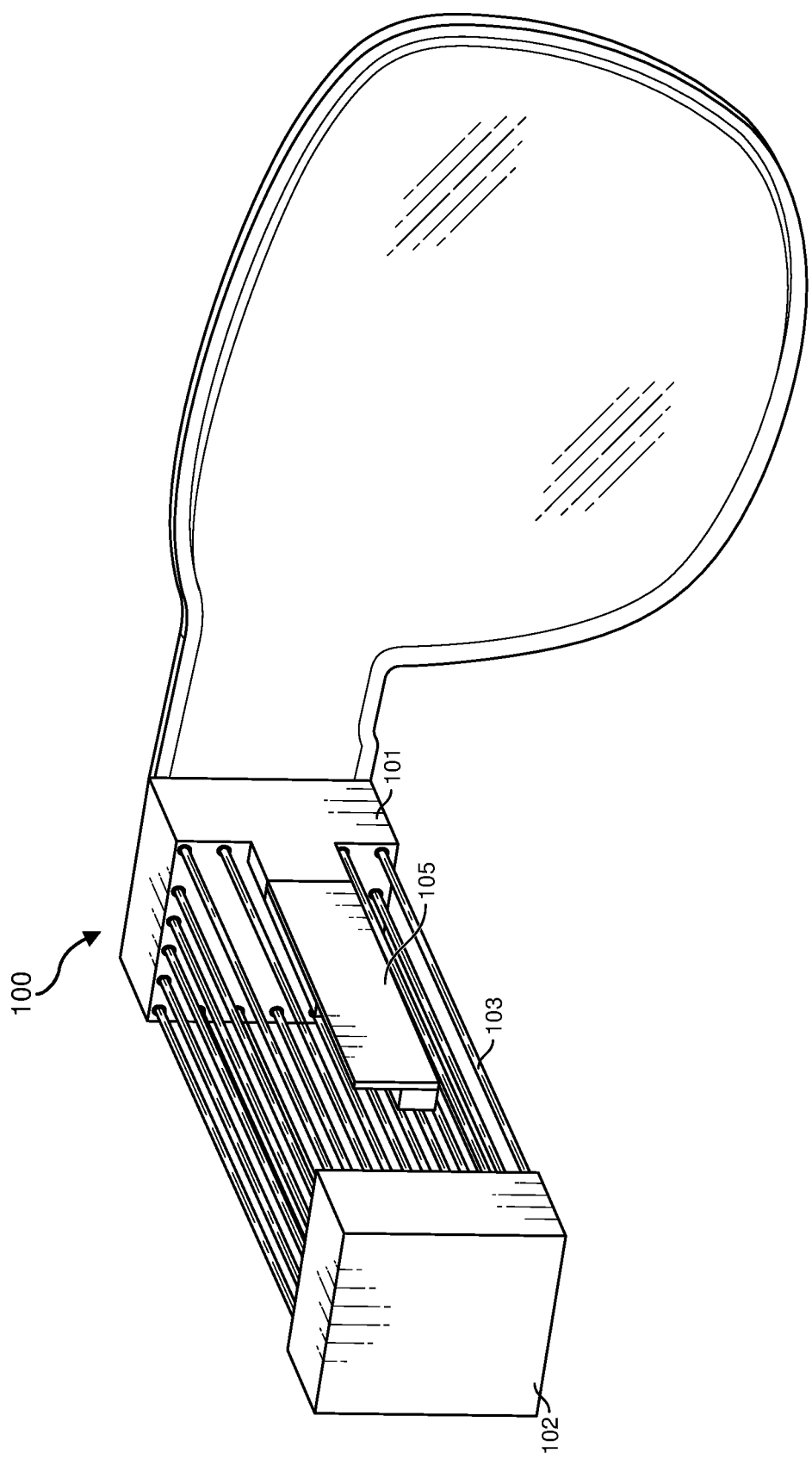
FIG. 8 illustrates an embodiment of a flexure guidance system in which multiple rows of wire flexures are implemented.

In some embodiments, the wire flexures 103 may each be respectively rigidly connected at each end to the distal end piece 102 and the proximal end piece 101. In some cases, the flexure guidance system 100 may include four wire flexures (three of which are visible in FIG. 7). In such embodiments, the distal end piece and the proximal end piece may be substantially square-shaped. The four wire flexures 103 may be rigidly connected to each of the four corners of the distal end piece and the proximal end piece. In some cases, each of the four wire flexures may itself comprise a group of wire flexures (as shown in FIG. 4). In other cases, a plurality of wire flexures 103 may be used which line the edges of the proximal and distal end pieces. For instance, as shown in FIG. 8, six wire flexures are used on each of the four sides of the proximal and distal end pieces. As will be understood, substantially any number of wire flexures 103 may be used, and any shape of proximal or distal end pieces may be used (e.g., radially-shaped end pieces). In cases where more wire flexures are used, the flexures may be thinner so as not to add a large amount of weight to the system. At least in some embodiments, using multiple smaller-diameter wires may provide better off-axis stiffness for the flexure guidance system 101. Accordingly, many different forms, numbers and types of wire flexures are contemplated herein.

The wire flexures may be made of titanium, stainless steel, beryllium, or substantially any other type of metal. In some examples, either the distal end piece or the proximal end piece may be substantially radially-shaped. In some cases, the flexure guidance system 100 may include components affixed thereto that compensate for movement of the wire flexures or the distal end piece in the z-axis direction. For example, in some cases, additional resistance to movement in the z direction (relative to the proximal end piece 101) may be provided by mechanical elements in addition to the wire flexures. These elements may reduce movement in the z direction, while still allowing movement in the x and y directions. In some cases, linear strip encoders (or other types of encoders including magnetic, capacitive, optical, etc.) may be affixed to the distal end of the flexure guidance system. These linear strip encoders may be implemented to track movement of the optical subassembly and connected combiner lens. Readings taken by the linear strip encoders may be fed to a processor or controller that interprets the readings to determine how far the optical assembly 105, the combiner lens, and/or the distal end piece 102 has moved. These readings can be used as feedback to determine how the wire flexures and actuators are behaving, how far the distal end piece is being moved when the actuators are moving, whether the system moves more easily in one direction, etc. This data may thus be used as feedback to refine and continually update the system to provide a smoother, more immersive experience for the end user.

Figure 9:
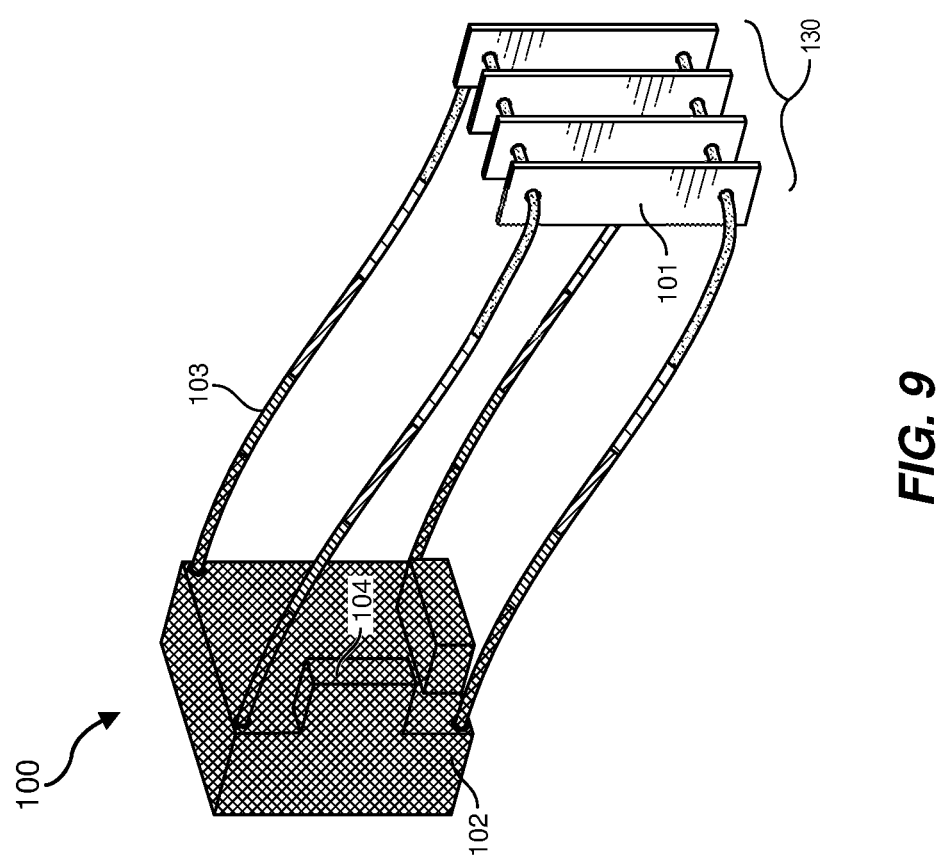
FIG. 9 illustrates an embodiment of a flexure guidance system in which the distal end piece includes a plurality of tiles.

FIG. 9 illustrates an embodiment in which the proximal end piece 101 is not a solid block, but is rather an array of tiles 130. Such an array of tiles may be used on either the proximal end, the distal end, or on both ends. The array of tiles 130 may include any number of tiles in any shape. These tiles may provide different strength and flexibility characteristics as opposed to a solid block. The array 130 may allow for some flexure, for example, in the proximal end piece 101, and may be better at overcoming spring force. Other tile arrangements may also be used in either the distal or proximal ends based on the type of system in which the array is implemented.

FIGS. 10A-10E illustrate embodiments in which one or more blade flexures may be used in place of (or in addition to) the wire flexures 103 of FIG. 1. The flexure guidance system 150 of FIG. 10A may be implemented to control movement of an optical subassembly (e.g., 105 of FIG. 5) and/or a connected combiner lens 158. The flexure guidance system 150 may include a proximal end piece 151, a distal end piece 152, and one or more blade flexures 153 that link the proximal end piece 151 to the distal end piece 152. As noted above, the proximal end piece 151 may be substantially stationary, while distal end piece 152 may refer to an end piece that moves relative to the proximal end piece. The blade flexure(s) 153 may be affixed to the proximal end piece 151 and to the combiner lens 158. The flexure guidance system 150 may also include support members 154A and 154B.

Figure 10A:
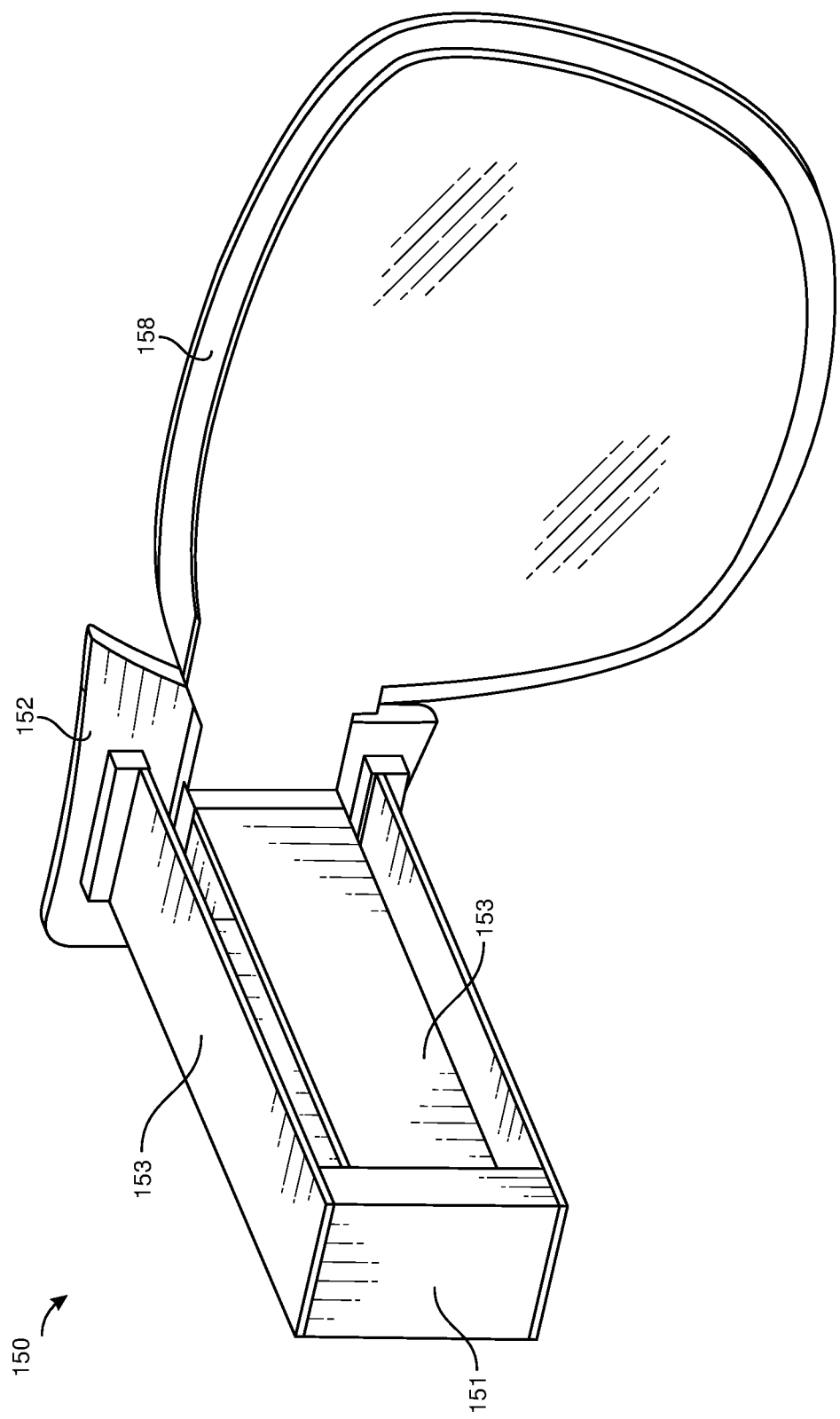
FIGS. 10A-10E illustrate embodiments of a flexure guidance system in which the distal end piece is moved relative to the proximal end piece via a blade flexure guidance system.
Figure 10B:
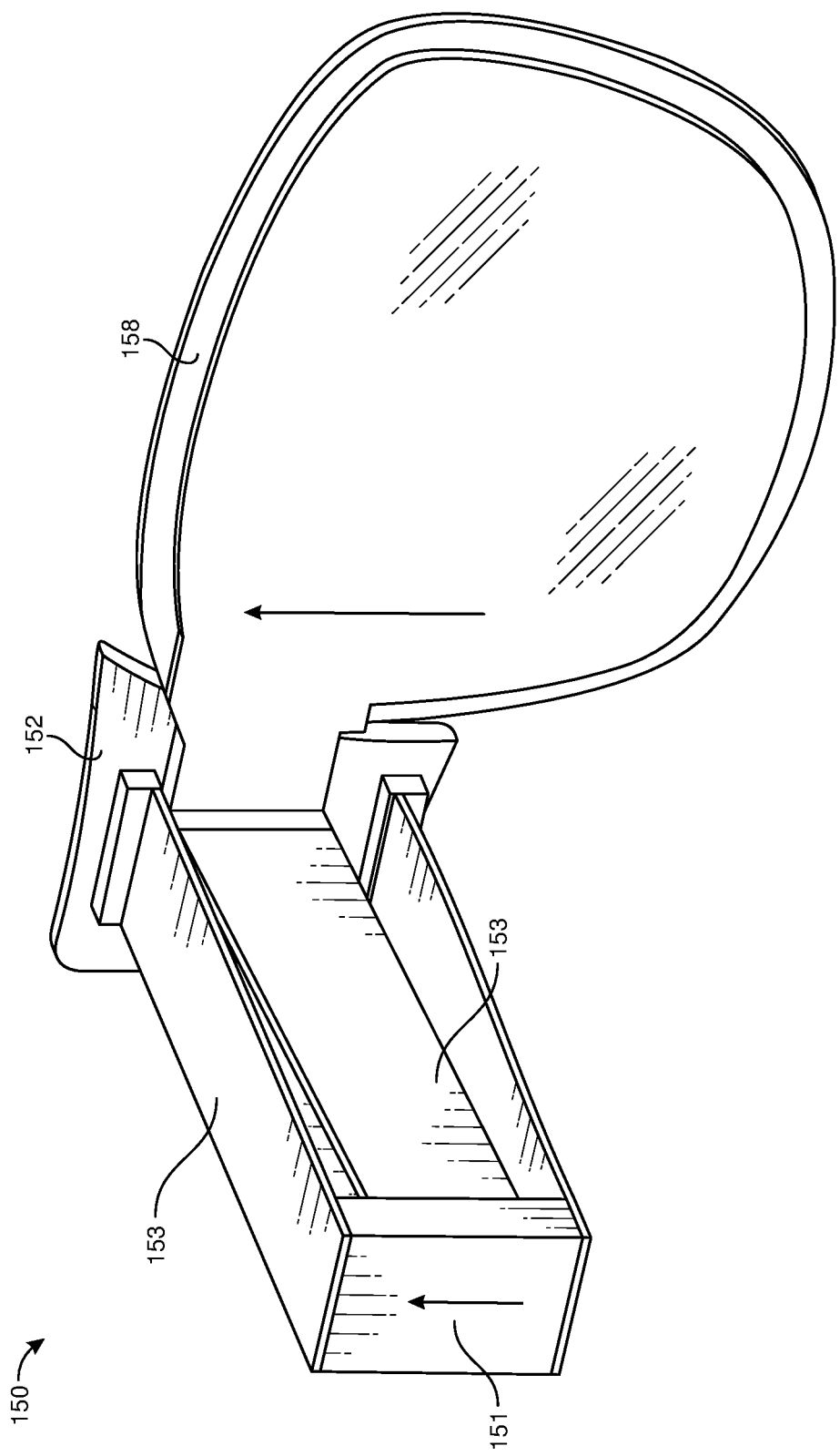
Figure 10C:
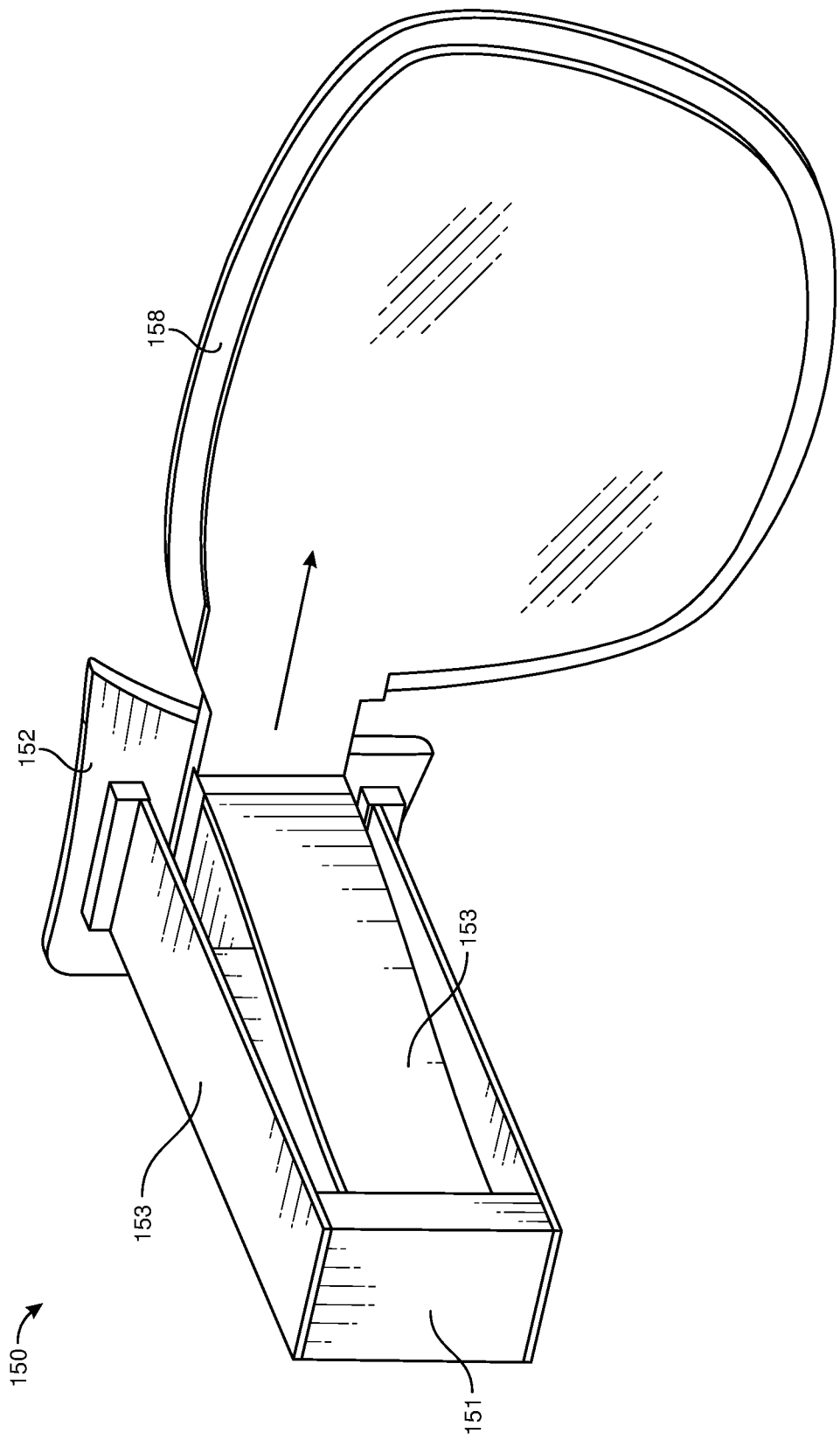

Accordingly, as shown in FIG. 10B, and in response to a control input from a controller, the blade flexure 153 may move upward toward an upper blade flexure. As the blade flexure 153 moves upward, the affixed combiner lens 158 also moves upward in relation to the proximal end piece 151. This process may move both the combiner lens 158 and any internal optics (e.g., a projection assembly). The movement may be controlled to align with the movements of the user's eyes. As such, when a user moves their eyes upward, the combiner lens 158 may be correspondingly moved upward as shown in FIG. 10B. If the user moves their eyes to the side, the combiner lens 158 may be moved to the side as shown in FIG. 10C. The amount of movement may be controlled via the input to the blade flexure (e.g., via a change in applied current or voltage). In some embodiments, the amount of movement may vary based on the amount of movement detected in the user's eyes. The movement of the combiner lens 158 may thus track the movement of the user's eyes to continually place images projected on the combiner lens in front of the user's eyes. As with the wire flexures described above, and as can be seen in FIGS. 10B and 10C, the blade flexures may be configured to move the combiner lens 158 in substantially any direction: up, down, left, right, diagonally, or combinations thereof.

In some embodiments, four different blade flexures may be implemented in the flexure guidance system 150, with two side blade flexures that are formed in a plane that is wide and thin. Vertical motion, as shown in FIG. 10B, may be applied by actuating the top and bottom blade flexures, while horizontal motion, as shown in FIG. 10C, may be applied by actuating the left- and right-side blade flexures. By arranging the wide portions of the opposing blade flexures perpendicularly, the side blade flexures provide stabilization during vertical motion, and the top and bottom blade flexures provide stabilization during lateral motion. As such, the blade flexures can provide both movement and stability to counteract the opposing sides' movements. This may increase stability in the overall flexure guidance system, providing a higher quality and less jittery image to the end user.

In some cases, the blade flexure(s) 153 may be spaced to form an interior cavity (e.g., similar to or the same as 110 of FIG. 1) between the distal end piece 152 and the proximal end piece 151. This interior cavity may house electronic components, including an optical subassembly (e.g., 105 of FIG. 5). The blade flexures 153 may act as actuators when stimulated with a proper amount of electric current. When the blade flexures actuate, the blade flexures bend in a specified direction. For example, a thin, flat metal region in the blade flexures 153 may be surrounded on top and bottom by a layer of piezoelectric ceramic, creating a piezoelectric bimorph. By partially or entirely coating the metal region in piezoelectric ceramic, the resulting flexure may respond to electrical stimuli by bending slightly in one direction or another. When the blade flexures bend, the distal end piece 153 also moves, and with it the optical subassembly, the combiner lens, and other connected components. Thus, based on incoming control signals, the blade flexures may bend and move along different axes of movement provided by the blade flexures 153. The blade flexures 153 may be composed of titanium, stainless steel, beryllium, or other metals or combinations of metals. In other embodiments, the blade flexures may be made of composite materials, plastic, or other materials that are capable of relatively small movements, yet generally hold the overall structure in place.

Figure 10D:
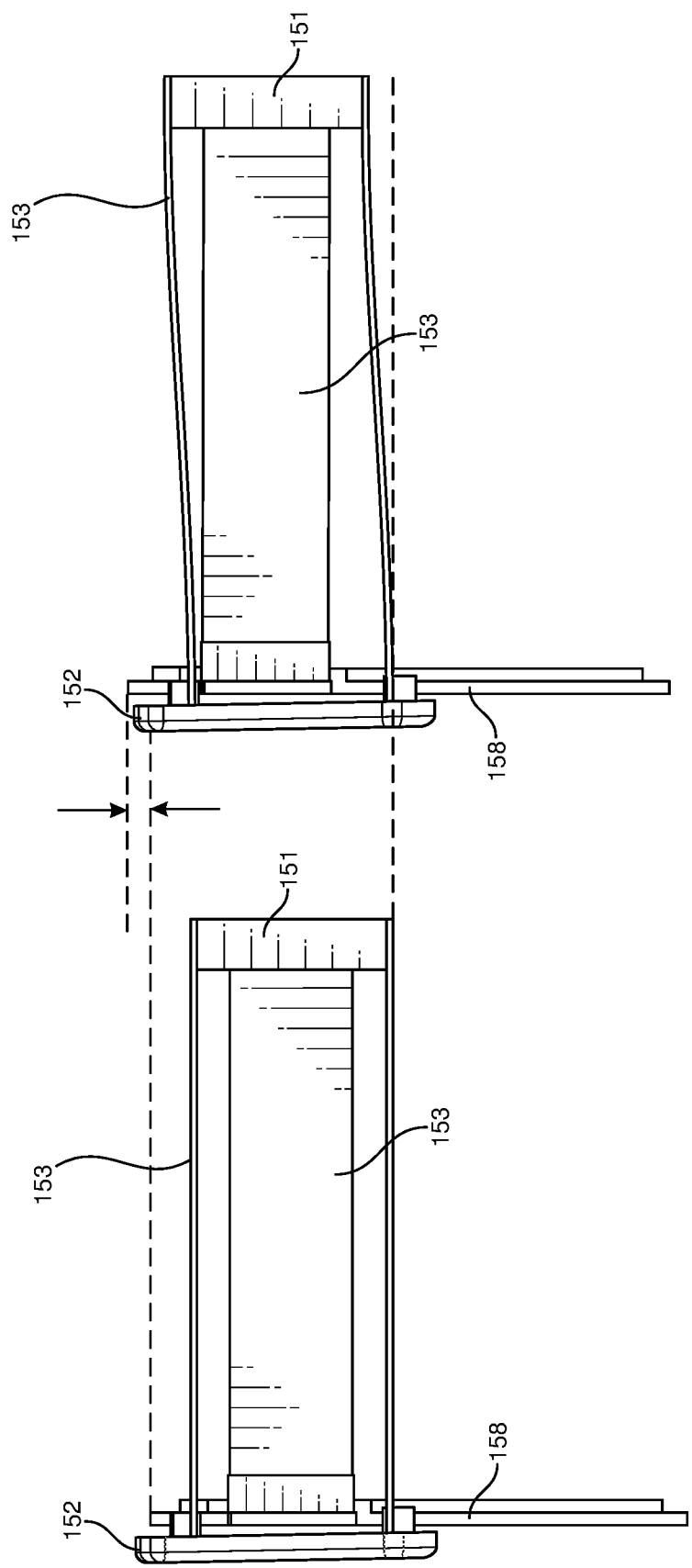
Figure 10E:
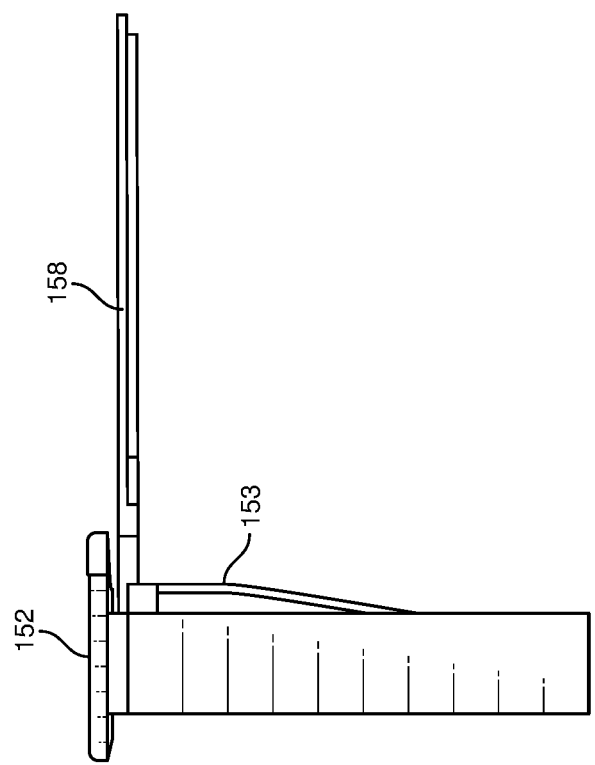
Figure 10E:
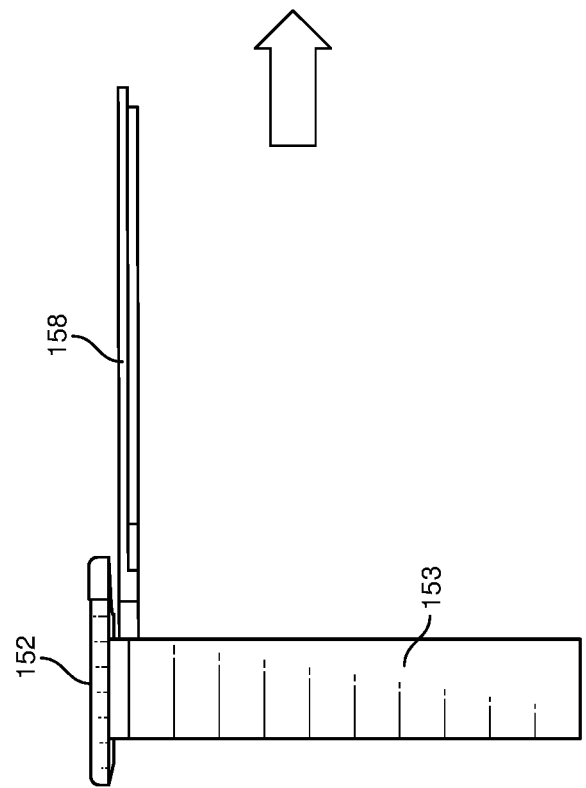

FIG. 10D illustrates a side view of the flexure guidance system 150. The flexure guidance system 150 may, for example, allow movement of the distal end piece 152 up and down relative to the proximal end piece 151. The vertical movement (y) may be provided while substantially preventing movement of the distal end piece 152 in the x or z directions. In FIG. 10D, the distal end piece 152 along with the combiner lens 158 has been moved upward along the y-axis relative to the proximal end piece 151. In FIG. 10E, the distal end piece 152 may be moved to the right along the x-axis, relative to the proximal end piece 151. By combining the movements of FIGS. 10D and 10E, the distal end piece 152 and the attached combiner lens 158 and associated optics may be moved in substantially any direction in order to follow the movements of the user's eyes.

Figure 11:
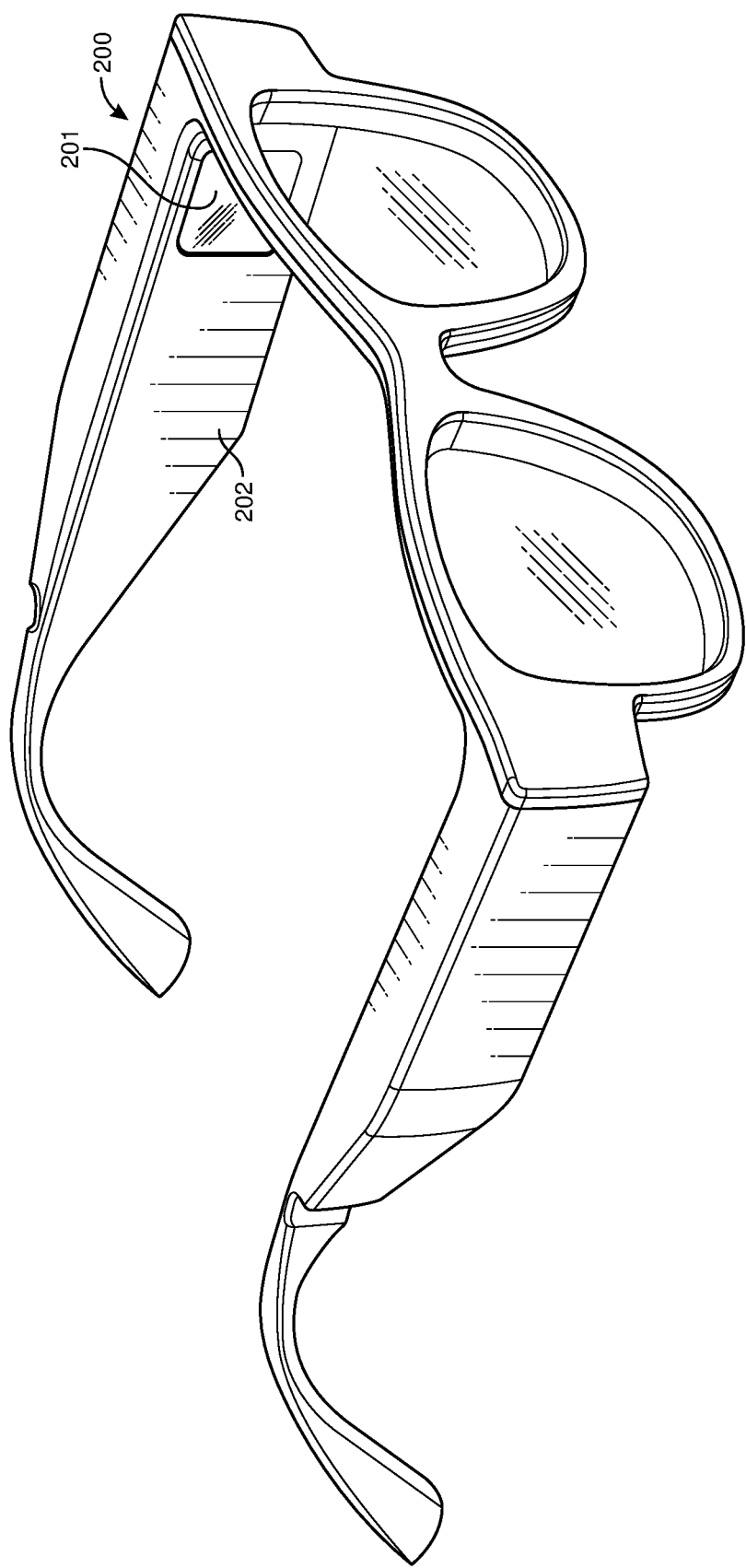
FIG. 11 illustrates a front perspective view of an embodiment in which a flexure guidance system is embedded within augmented reality glasses.
Figure 12:
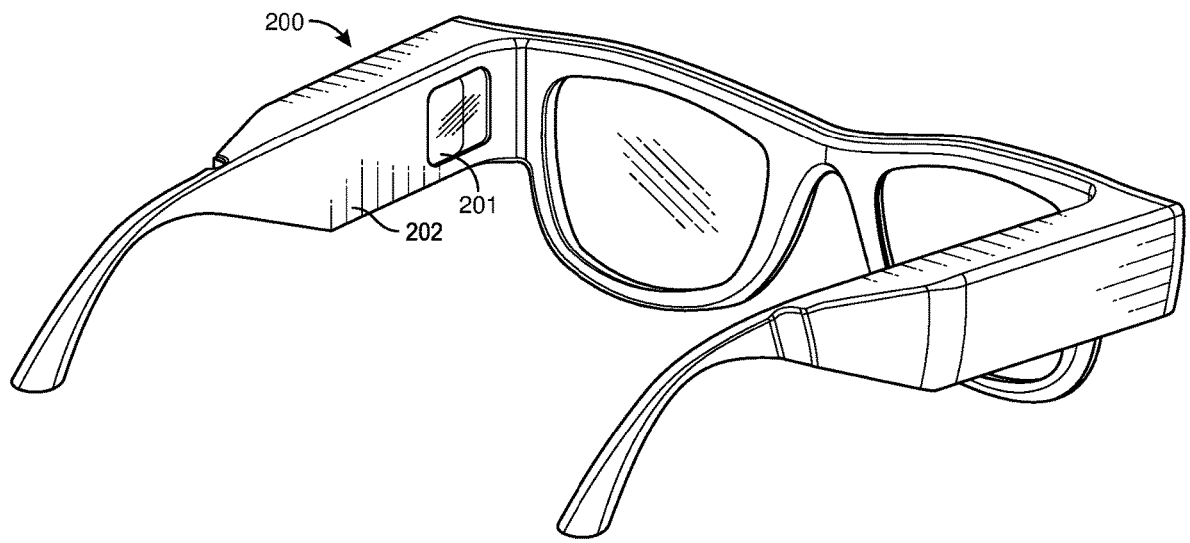
FIG. 12 illustrates a rear perspective view of an embodiment in which a flexure guidance system is embedded within augmented reality glasses.

In some examples, the control inputs of the flexure guidance system may be generated based on tracked eye movements of a user's eye (or pair of eyes). Indeed, as shown in FIGS. 11 and 12, the flexure guidance system may be implemented in a pair of augmented reality glasses. FIGS. 11 and 12 illustrate front and rear perspective views of a pair of augmented reality (AR) glasses 200. Although AR glasses are shown in FIGS. 11 and 12, it will be understood that virtual reality (VR) or mixed reality glasses or other eyewear may also be used. The AR glasses 200 include an outer frame 202 in which the flexure guidance system 100 may be housed. The AR glasses may also include combiner lenses, and waveguides 201 on each arm of the glasses. The optical subassembly (e.g. 105 of FIG. 1) may lie behind or near the waveguide 201, but is not visible in FIGS. 11 and 12. Each arm of the glasses may include its own covering or housing 202 that goes around the internal components including the actuators 106, the optical subassembly 105, and/or other components including a battery, processor, data store (e.g. a flash memory card), eye-tracking hardware and/or software, or other components. The eye-tracking hardware and/or software may be configured to track movements of the user's eyes, and move the distal end piece 102 (and thus the optical subassembly 105 and the combiner lens 101) according to the user's eye movements.

The AR glasses 200 may also include a wireless communication means such as a WiFi radio, cellular radio, Bluetooth radio, or similar communication device. The AR glasses 200 may thus receive video signals from an external source which are to be projected to the user's eyes. While the user is viewing the projected images on the combiner lenses 108, the user's eyes and/or head may move, perhaps in reaction to the content being displayed on the combiner lenses. As the user moves their eyes and/or head, the integrated eye-tracking system may track the user's eyes, and move the connected optical subassembly 105 and combiner lenses 108 in tandem with the user's eye movements. This may provide a more pleasant AR experience for the user.

Figure 13:
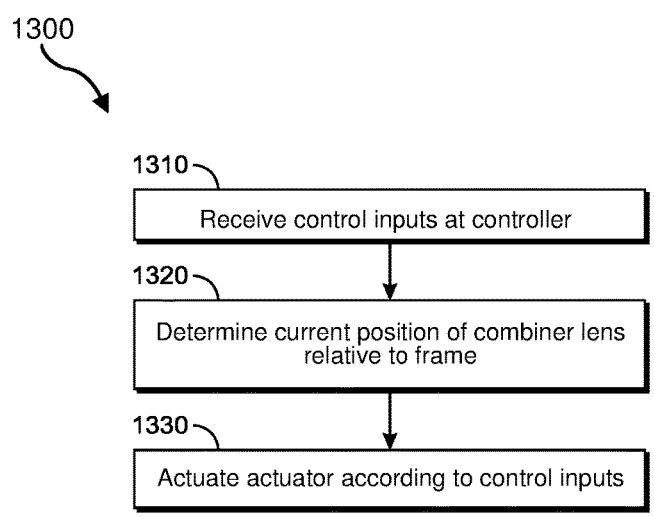
FIG. 13 illustrates a flow diagram of an exemplary method for controlling movement of an optical subassembly using a flexure guidance system.

FIG. 13 illustrates a flowchart of a method for controlling movement of an optical subassembly using a flexure guidance system. For example, a computer-implemented method 1300 may be provided for controlling movement of an optical assembly and connected combiner lens. This method 1300 may include receiving control inputs at a controller (1310). The controller may be part of an optical subassembly that is connected to a combiner lens via a flexure guidance system. The method may include determining a current position of the combiner lens relative to a frame (1320). The combiner lens may be at least partially transmissive to visible light, and may be configured to direct image data provided by the optical subassembly to a user's eye. The method may also include actuating an actuator configured to move the optical subassembly and connected combiner lens according to the received control inputs (1330). The actuator may move the optical subassembly and connected combiner lens through translational movements in the flexure guidance system.

In some examples, the method for controlling movement of an optical subassembly using a flexure guidance system may further include tracking eye movements of the user relative to the combiner lens, and generating the control inputs based on the tracked eye movements. The user's eyes may be tracked in real time and, in similar manner, corresponding control inputs may be generated in real time. In some examples, one or more actuators may apply motive force to a distal end (e.g., 102) of the flexure guidance system 100. In some cases, piezoelectric strain sensors may be implemented to monitor for flexure of the flexure guidance system. The piezoelectric strain sensors may be calibrated to zero to measure strain differential values as movements are applied by the actuators. By precisely tracking movements initiated by the actuators, the system can provide a tailored experience that learns how far and how fast the actuators move the distal end piece. Still further, the system may use machine learning hardware and/or software to learn how the user's eyes and head move, identify movement patterns, and learn to anticipate the user's movements with proactive movements of the optical subassembly and combiner lens. Thus, over time, as a user uses the AR glasses (e.g., 200 of FIG. 11), the glasses adapt to that user and adapt to how the actual actuations by the actuators are translated into movements through the wire flexures.

In some examples, the above-described method may be encoded as computer-readable instructions on a computer-readable medium. For example, a computer-readable medium may include one or more computer-executable instructions that, when executed by at least one processor of a computing device, may cause the computing device to receive control inputs at a controller. The controller may be part of an optical subassembly that is connected to a combiner lens via a flexure guidance system. The computing device may then determine a current position of the combiner lens relative to a frame. The combiner lens may be at least partially transmissive to visible light, and may be configured to direct image data provided by the optical subassembly to a user's eye. The computing device may also actuate actuators configured to move the optical subassembly and connected combiner lens according to the received control inputs. As such, the actuator may move the optical subassembly and connected combiner lens through translational movements in the flexure guidance system.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

Thus, the flexure guidance system described herein may be implemented in a variety of different devices, including augmented reality, virtual reality or other types of glasses or headwear. The flexure guidance system provides flexibility in the x and y directions, while providing off-axis stability to prevent unwanted movement. The flexure guidance system allows actuators to produce small movements that align with the movements of a user's eyes or head. In conjunction with these movements, associated optics hardware and displays may move as controlled by the actuators. The wire flexure described herein is light enough to be implemented in headwear that is comfortable to wear, and small enough to be practical in such an implementation.

EXAMPLE EMBODIMENTS

Example 1. A flexure guidance system comprising: a distal end piece, a proximal end piece, and a plurality of wire flexures that link the distal end piece to the proximal end piece, wherein the linking wire flexures are spaced to form an interior cavity between the distal end piece and the proximal end piece, the interior cavity housing one or more electronic components, and wherein one or more actuators move the electronic components according to input signals along one or more axes of movement provided by the plurality of wire flexures.

Example 2. The flexure guidance system of Example 1, wherein the electronic components comprise an optical subassembly.

Example 3. The flexure guidance system of any of Examples 1-2, wherein the optical subassembly comprises: at least one laser, at least one waveguide, and at least one spatial light modulator.

Example 4. The flexure guidance system of any of Examples 1-3, wherein the flexure guidance system substantially allows movement of the distal end piece in the x and y directions relative to the proximal end piece, while substantially preventing movement of the distal end piece in the z direction.

Example 5. The flexure guidance system of any of Examples 1-4, wherein the plurality of wire flexures are each respectively rigidly connected at each end to the distal end piece and the proximal end piece.

Example 6. The flexure guidance system of any of Examples 1-5, wherein the plurality of wire flexures includes four wire flexures, wherein the distal end piece and the proximal end piece are substantially square-shaped, and wherein the four wire flexures are rigidly connected to each of the four corners of the distal end piece and the proximal end piece.

Example 7. The flexure guidance system of any of Examples 1-6, wherein each of the four wire flexures comprises a group of wire flexures, such that the four corners of the distal end piece and the four corners of the proximal end piece are connected using the four groups of wire flexures.

Example 8. The flexure guidance system of any of Examples 1-7, further comprising one or more components affixed to the flexure guidance system that compensate for movement of the flexure wires or the distal end piece in the z-axis direction.

Example 9. The flexure guidance system of any of Examples 1-8, wherein at least one of the distal end piece or the proximal end piece comprises an array of tiles.

Example 10. The flexure guidance system of any of Examples 1-9, wherein the one or more actuators comprise piezoelectric benders.

Example 11. The flexure guidance system of any of Examples 1-10, wherein the control inputs are generated based on tracked eye movements of a user's eye.

Example 12. A computer-implemented method comprising: receiving one or more control inputs at a controller, the controller being part of an optical subassembly that is connected to a combiner lens via a flexure guidance system, determining a current position of the combiner lens relative to a frame, wherein the combiner lens is at least partially transmissive to visible light, and is configured to direct image data provided by the optical subassembly to a user's eye, and actuating at least one actuator configured to move the optical subassembly and connected combiner lens according to the received control inputs, wherein the actuator moves the optical subassembly and connected combiner lens through translational movements in the flexure guidance system.

Example 13. The computer-implemented method of Example 12, further comprising: tracking eye movements of the user relative to the combiner lens, and generating the control inputs based on the tracked eye movements.

Example 14. The computer-implemented method of any of Examples 12-13, wherein the at least one actuator applies motive force to a distal end of the flexure guidance system.

Example 15. The computer-implemented method of any of Examples 12-14, wherein one or more piezoelectric strain sensors are implemented to monitor for flexure of the flexure guidance system.

Example 16. The computer-implemented method of any of Examples 12-15, wherein the piezoelectric strain sensors are calibrated to zero to measure strain differential values as movements are applied by the actuators.

Example 17. The computer-implemented method of any of Examples 12-16, wherein one or more linear strip encoders are affixed to the distal end of the flexure guidance system, and are implemented to determine movement of the optical subassembly and connected combiner lens.

Example 18. A flexure guidance system comprising: a distal end piece, a proximal end piece, and a plurality of blade flexures that link the distal end piece to the proximal end piece, wherein the linking blade flexures are spaced to form an interior cavity between the distal end piece and the proximal end piece, the interior cavity housing one or more electronic components, and wherein one or more actuators move the electronic components according to input signals along one or more axes of movement provided by the plurality of blade flexures.

Example 19. The flexure guidance system of Examples 18, wherein the electronic components comprise an optical subassembly that includes at least one laser, at least one waveguide, and at least one spatial light modulator.

Example 20. The flexure guidance system of any of Examples 18-19, wherein the blade flexures are made of at least one of titanium, stainless steel, or beryllium.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to perform a function, use the result of the transformation to perform a function, and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

I claim:

1. A computer-implemented method comprising:
   receiving one or more control inputs at a controller, the controller being part of an optical subassembly that is connected to a combiner lens via a flexure guidance system;
   determining a current position of the combiner lens relative to a frame, wherein the combiner lens is at least partially transmissive to visible light, and is configured to direct image data provided by the optical subassembly to a user's eye;
   identifying, using machine learning, one or more eye movement patterns associated with the user; and
   proactively actuating at least one actuator configured to move the optical subassembly and connected combiner lens according to the one or more eye movement patterns identified using machine learning, wherein the actuator moves the optical subassembly and connected combiner lens through translational movements in the flexure guidance system.

2. The computer-implemented method of claim 1, wherein the actuator moves the optical subassembly and connected combiner lens according to one or more input signals.

3. The computer-implemented method of claim 2, wherein the actuator is configured to bend in a specified direction according to the input signals, the amount of bend in the actuator being specified by the input signals.

4. The computer-implemented method of claim 1, wherein the one or more eye movement patterns are identified by analyzing the user's eye movements over a specified time period.

5. The computer-implemented method of claim 1, wherein the proactive actuations of the actuator are performed in anticipation of movements made by the user.

6. The computer-implemented method of claim 1, further comprising identifying, using machine learning, one or more head movement patterns associated with the user's head.

7. The computer-implemented method of claim 6, wherein the actuator is proactively actuated according to the one or more head movement patterns identified using machine learning.

8. The computer-implemented method of claim 1, wherein the actuator is proactively actuated in a manner specific to each user according to that user's learned movement patterns.

9. The computer-implemented method of claim 8, wherein the controller adapts the proactive movements of the actuator to each user over time.

10. A flexure guidance system comprising:
    a distal end piece;
    a proximal end piece;
    a plurality of wire flexures that link the distal end piece to the proximal end piece; and
    a controller;
    wherein the linking wire flexures are spaced to form an interior cavity between the distal end piece and the proximal end piece, the interior cavity housing one or more electronic components,
    wherein the controller, using machine learning, identifies one or more eye movement patterns associated with the user, and
    wherein one or more actuators proactively move the electronic components the one or more eye movement patterns identified using machine learning along one or more axes of movement provided by the plurality of wire flexures.

11. The flexure guidance system of claim 10, wherein the one or more actuators are configured to bend in a specified direction according to one or more input signals received at the controller.

12. The flexure guidance system of claim 11, wherein the amount of bend in the actuators is specified by the input signals received at the controller.

13. The flexure guidance system of claim 10, wherein the input signals are based on the identified eye movement patterns.

14. The flexure guidance system of claim 10, wherein subsequent eye or head movements of the user are used by the controller as feedback to refine and update the proactive movements of the actuators.

15. The flexure guidance system of claim 14, wherein one or more linear strip encoders are affixed to the distal end of the flexure guidance system.

16. The flexure guidance system of claim 15, wherein the one or more linear strip encoders are implemented to provide feedback indicating movement of the optical subassembly and connected combiner lens.

17. The flexure guidance system of claim 10, wherein the flexure guidance system facilitates movement of the distal end piece in the x and y directions relative to the proximal end piece, while substantially preventing movement of the distal end piece in the z direction.

18. The flexure guidance system of claim 10, further comprising one or more components affixed to the flexure guidance system that compensate for movement of the flexure wires or the distal end piece in the z-axis direction.

19. The flexure guidance system of claim 10, further comprising one or more piezoelectric strain sensors that are implemented to monitor for flexure of the flexure guidance system.

20. A flexure guidance system comprising:
    a distal end piece;
    a proximal end piece;
    a plurality of blade flexures that link the distal end piece to the proximal end piece; and
    a controller;
    wherein the controller, using machine learning, identifies one or more eye movement patterns associated with the user, and
    wherein one or more actuators proactively move the electronic components the one or more eye movement patterns identified using machine learning along one or more axes of movement provided by the plurality of wire flexures.

* * * * *